US006841878B1

(12) United States Patent
Ben-Tzur et al.

(10) Patent No.: US 6,841,878 B1
(45) Date of Patent: Jan. 11, 2005

(54) INTEGRATED CIRCUIT WITH IMPROVED RC DELAY

(75) Inventors: Mira Ben-Tzur, Sunnyvale, CA (US); Krishnaswamy Ramkumar, San Jose, CA (US); Alain Blosse, Belmont, CA (US); Fuad Badrieh, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/672,895

(22) Filed: Sep. 26, 2003

Related U.S. Application Data

(62) Division of application No. 10/183,095, filed on Jun. 26, 2002, now Pat. No. 6,660,661.

(51) Int. Cl.[7] .............................................. H01L 23/48
(52) U.S. Cl. ....................... 257/750; 257/758; 257/760
(58) Field of Search ................................. 257/750, 758, 257/859, 760

(56) References Cited

U.S. PATENT DOCUMENTS

| | | | |
|---|---|---|---|
| 5,668,398 A | | 9/1997 | Havemann et al. |
| 5,759,906 A | * | 6/1998 | Lou ............................ 438/623 |
| 5,918,149 A | | 6/1999 | Besser et al. |
| 5,946,601 A | * | 8/1999 | Wong et al. ................ 438/783 |
| 5,963,830 A | | 10/1999 | Wang et al. |
| 6,120,844 A | | 9/2000 | Chen et al. |
| 6,143,638 A | * | 11/2000 | Bohr .......................... 438/612 |
| 6,204,200 B1 | | 3/2001 | Shieh et al. |
| 6,228,761 B1 | | 5/2001 | Ngo et al. |
| 6,376,360 B1 | * | 4/2002 | Cha et al. ................... 438/624 |
| 6,514,881 B1 | * | 2/2003 | Coffman ..................... 438/780 |
| 6,522,005 B1 | * | 2/2003 | Allman et al. .............. 257/758 |
| 2002/0164868 A1 | * | 11/2002 | Chang et al. ............... 438/622 |

OTHER PUBLICATIONS

Seong Geon Park, et al. "A New ALD–TiN/CoSi2 Contact Plug Process for Reliable and Low Defect Density Bit–Line Integration in Sub–Quarter Micron Giga–bit DRAM" IEEE 2002, pp. 282–284; Semiconductor R&D Center, Samsung Electronics Co. Ltd., Korea.

J.T. Wetzel, et al. "Evaluation of Material Property Requirements and Performance of Ultra–Low Dielectric Constant Insulators for Inlaid Copper Metallization" IEEE 2001, pp. 4.1.1–4.1.3; Int'l Sematech, Austin, TX; Texas Instruments, Dallas, TX; Motorola, Austin, TX; TSMC, Taiwan; IBM, Burlington.

M. Ben–Tzur, et al. "Integrated of Low–K Dielectrics In The Passivation Level of A1 Based Multilevel Interconnect Technology" submitted for Publication Mar. 2002, (2 pgs); Cypress Semiconductor, San Jose, CA, USA.

Wei–Jen Hsia, et al. "Flowfill Technology Low Dielectric Constant Materials" Retrieved from the Internet: <URL:http//www.trikon.com [printed on Mar. 29, 2002] (4 pgs); LSI Logic, CA; Trikon Technologies Ltd.

Bruce W. McGaughy, et al. "A Simple Method for On–Chip, Sub–Femto Farad Interconnect Capacitance Measurement" IEEE vol. 18, No. 1, Jan. 1997, pp. 21–23; University of California, Berkeley, CA., USA.

Conference highlights latest data on SILK resin, expanded Alliance membership, (3 pgs); Dec. 5, 2001; The Dow Chemical Company and Loomis Group; Midland, Michigan, USA.

INTERCONNECT; The International Technology Roadmap For Semiconductors; pp. 1–25, 2001 Edition.

* cited by examiner

Primary Examiner—Tuan H. Nguyen
(74) Attorney, Agent, or Firm—Okamoto & Benedicto LLP

(57) ABSTRACT

In one embodiment, a passivation level includes a low-k dielectric. The low-k dielectric helps lower the capacitance of a metal line in a last metal level, which may be just below the passivation level. In another embodiment, the metal line is relatively thick. This helps lower the metal line's resistance and resulting RC delay.

12 Claims, 18 Drawing Sheets

INTEGRATED CIRCUIT WITH IMPROVED RC DELAY

REFERENCE TO RELATED APPLICATION

This application is related to the following commonly-assigned disclosure, which is incorporated herein by reference in its entirety: U.S. application Ser. No. 10/184,336, entitled "PROTECTION OF A LOW-K DIELECTRIC IN A PASSIVATION LEVEL,", filed on Jun. 26, 2002 by Mira Ben-Tzur, Krishnaswamy Ramkumar, Saurabh Dutta Chowdhury, and Michal Efrati Fastow.

This application is a divisional of U.S. application Ser. No. 10/183,095, filed by Mira Ben-Tzur, Krishnaswamy Ramkumar, Saurabh Dutta Chowdhury, and Michal Efrati Fastow on Jun. 26, 2002 now U.S. Pat. No. 6,660,661.

BACKGROUND OF THE INVENTION

1. Field of the Invention

The present invention relates generally to integrated circuits, and more particularly to integrated circuit fabrication processes and structures.

2. Description of the Background Art

A typical integrated circuit has several vertically stacked levels, with any given level comprising one or more layers of materials. The topmost level in an integrated circuit is referred to as a "passivation level." The passivation level helps protect an integrated circuit's structures during packaging and in operation. Below the passivation level are metal and dielectric levels. Metal levels include metal lines for carrying electrical signals. Dielectric levels provide electrical isolation between metal levels.

The speed at which a signal is propagated in an integrated circuit is limited by the delay through the metal line carrying the signal. This delay, commonly known as "RC delay," is determined by the product of the resistance (R) and capacitance (C) of the metal line. Reducing the resistance and/or capacitance of a metal line lowers its RC delay and increases signal propagation speed. Thus, reducing the RC delay of metal lines plays a major role in making integrated circuits run faster.

SUMMARY

In one embodiment, a passivation level includes a low-k dielectric. The low-k dielectric helps lower the capacitance of a metal line in a last metal level, which may be just below the passivation level. In another embodiment, the metal line is relatively thick. This helps lower the metal line's resistance and resulting RC delay.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not to scale unless otherwise noted.

DETAILED DESCRIPTION

In the present disclosure, numerous specific details are provided such as examples of apparatus, process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
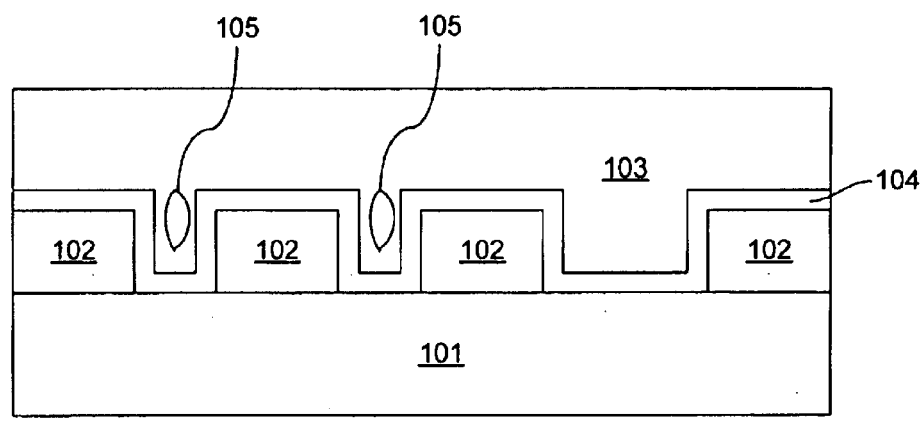
FIG. 1 shows a side cross-sectional view of a passivation level of a conventional integrated circuit.

Referring now to FIG. 1, there is shown a portion of a conventional integrated circuit with a passivation level comprising a capping layer 104 and a topside material 103. The passivation level protects underlying structures such as metal lines 102. Capping layer 104 may be a 1000 Angstroms thick silicon dioxide layer. A silicon dioxide layer may be deposited using TEOS (tetraethyl ortho-silicate) as a precursor. Topside material 103 may comprise silicon nitride deposited to a thickness of 9000 Angstroms as measured from the topmost portion of a dielectric 101. Silicon nitride may be deposited using silane or dichlorosilane as a precursor. Both capping layer 104 and topside material 103 may be deposited by plasma enhanced chemical vapor deposition (PECVD).

Metal lines 102 may be in a last metal level (i.e., the metal level closest to the passivation level) of an integrated circuit. Underneath metal lines 102, which may be of aluminum, is a dielectric level that comprises dielectric 101. Dielectric 101 may be a layer of silicon dioxide. In FIG. 1, various levels underneath dielectric 101 are not shown for clarity of illustration.

Because of the inability of topside material 103 to fill small spaces, air gaps 105 may or may not form between metal lines 102. Air gaps 105 tend to form at relatively narrow metal line spacing because the aspect ratio in such cases is typically large. Air gaps 105 are voids and thus have a dielectric constant approximately equal to 1. The low dielectric constant of air gaps 105 helps lower capacitance on metal lines 102. However, the size and formation of air gaps 105 are not readily controllable because they vary with the critical dimensions of metal lines 102. Additionally, the dielectric constant of topside material 103 is relatively high (e.g., the dielectric constant of silicon nitride is approximately 7.0), which offsets the low dielectric constant of air gaps 105.

Figure 2A:
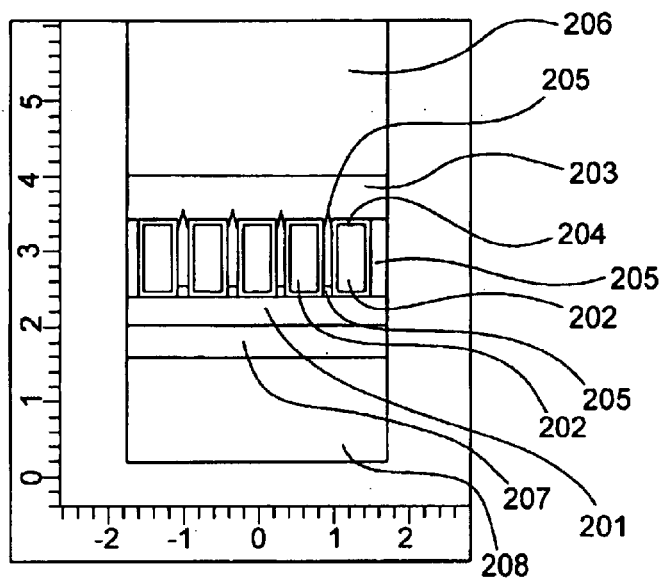
FIGS. 2(a)–2(f) schematically illustrate a problem with the passivation level of FIG. 1.

FIGS. 2(a)–2(f) schematically illustrate the above mentioned air gap formation problem with the passivation level of FIG. 1. Referring to FIG. 2(a), a passivation level comprising a capping layer 204 of silicon dioxide and a topside material 203 of silicon nitride protects metal lines 202. Also shown in FIG. 2(a) but not necessary to the present discussion are a layer 208 of silicon dioxide, a metal level 207, a layer 201 of silicon dioxide, and air 206.

The inability of topside material 203 to fill small spaces results in air gaps 205 between metal lines 202. Note that some structures are not labeled in FIGS. 2(a)–2(f) for clarity of illustration. For example, only some of metal lines 202 and air gaps 205 are labeled in FIGS. 2(a)–2(f).

Figure 2B:
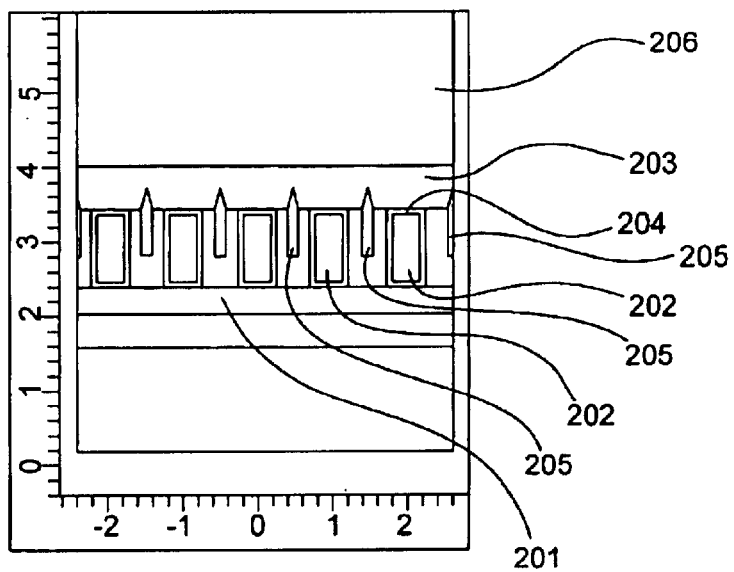
Figure 2C:
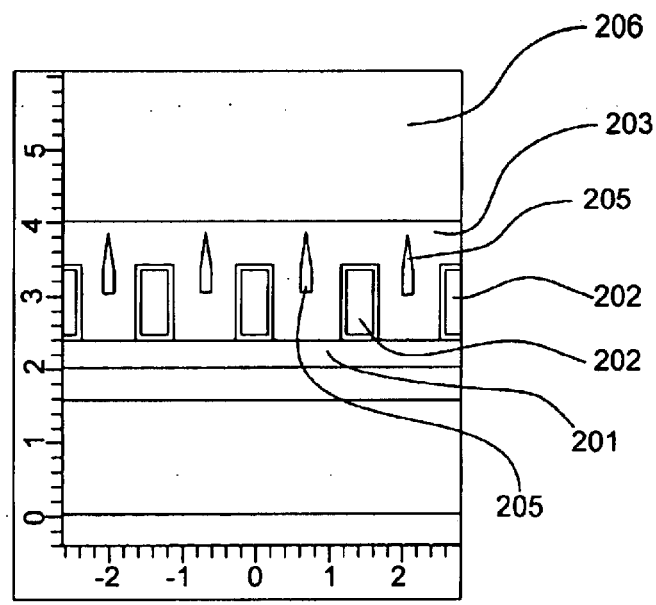
Figure 2D:
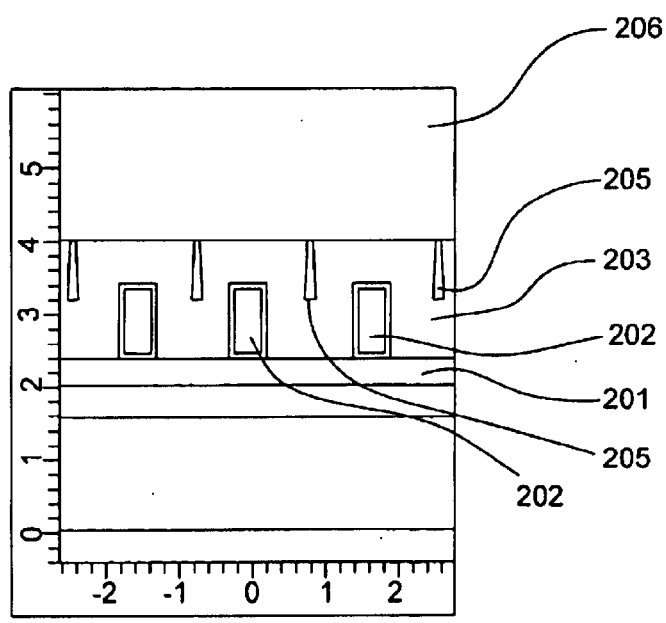
Figure 2E:
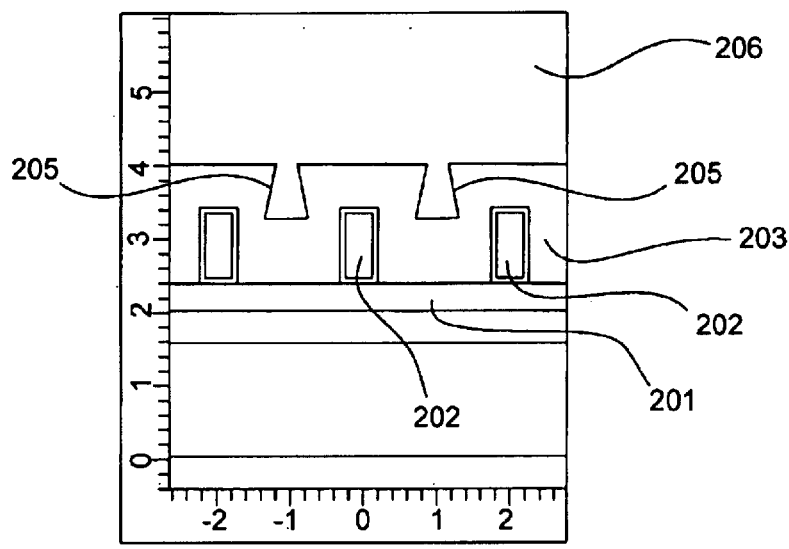
Figure 2F:
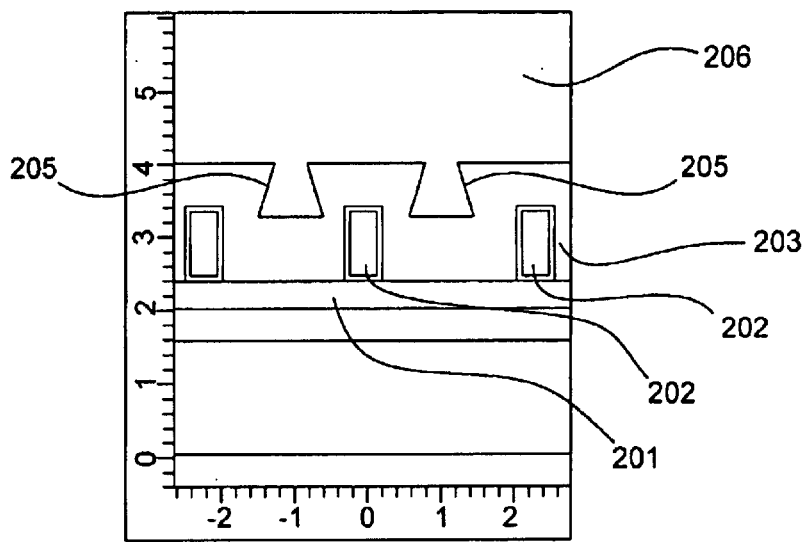

FIGS. 2(a)–2(f) show what happens to air gaps 205 as the space between metal lines 202 is widened. FIG. 2(b) shows air gaps 205 when the space between metal lines 202 is widened from that in FIG. 2(a), FIG. 2(c) shows air gaps 205 when the space between metal lines 202 is widened from that in FIG. 2(b), and so on. As the space between metal lines 202 is widened, air gaps 205 tend to move away from metal lines 202 and shrink in size as illustrated in FIGS. 2(a) through 2(f). That is, if a space between metal lines 202 is wide enough, topside material 203 may fill the space without forming an air gap 205. Thus, although air gaps 205 have a low dielectric constant, they do not always form between metal lines 202. Additionally, even if air gaps 205 do form, the relatively high dielectric constant of topside material 203 between metal lines results in a relatively high RC delay on metal lines 202.

Figure 3A:
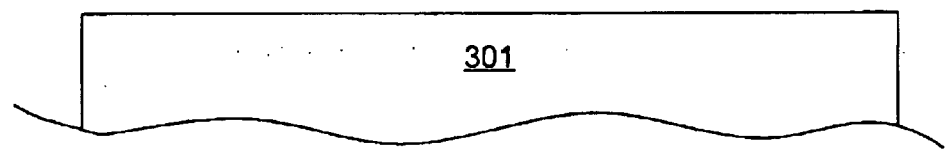
FIGS. 3(a)–3(h) show side cross-sectional views of an integrated circuit being fabricated in accordance with an embodiment of the present invention.

An embodiment of the present invention is now described with reference to the side cross-sectional views of FIGS. 3(a)–3(h). FIG. 3(a) shows a side cross-sectional view of a dielectric level comprising a dielectric 301. In one embodiment, dielectric 301 comprises silicon dioxide. As will be further explained below, dielectric 301 is preferably a low-k dielectric. Dielectric 301 may be on a semiconductor substrate. Depending on the application, there may be metal levels and other dielectric levels below dielectric 301.

Figure 3B:
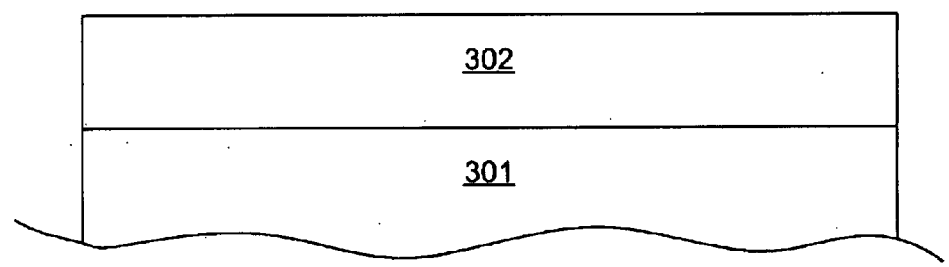

In FIG. 3(b), a metal level is formed by first depositing a metal 302 over dielectric 301. The metal level including metal 302 may be the last metal level just below the passivation level; the last metal level may also be the "first metal level" if it is the only metal level in the integrated circuit. It is to be noted that as used in the present disclosure, the terms "over", "overlying", "under" and "underlying" refer to the relative placement of two materials that may or may not be directly in contact with each other. That is, the two materials may be separated by another material.

In one embodiment, metal 302 comprises aluminum. Other interconnect materials may also be used as a metal 302. Metal 302 may be deposited by physical vapor deposition, for example. The thickness of metal 302 depends on the application. Advantageously, metal 302 is deposited to be as thick as the application will allow to lower its resistance and thereby reduce its RC delay. In one embodiment, an aluminum metal 302 is deposited to a thickness of approximately 8000 Angstroms. As will be further discussed later on below, a thicker aluminum metal 302 (e.g., between 8000 Angstroms and 15000 Angstroms, preferably 12000 Angstroms) results in lower RC delay.

Figure 4:
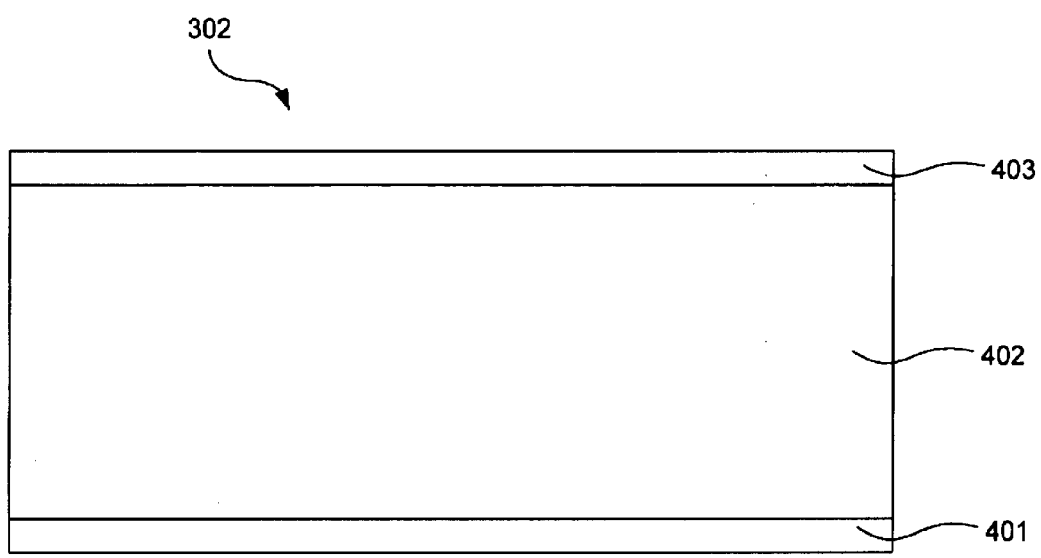
FIG. 4 shows a side cross-sectional view of a metal stack in accordance with an embodiment of the present invention.

Referring to FIG. 4, metal 302 may also be a metal stack that comprises a layer 401 (e.g., titanium, titanium-tungsten, titanium/titanium-tungsten, or titanium-nitride), a metal layer 402, and a layer 403 (e.g., titanium-tungsten, titanium/titanium-tungsten, or titanium-nitride). In one embodiment, layer 401 is a 300 Angstroms thick titanium layer deposited on a dielectric level (not shown), while layer 403 is a 300 Angstroms thick titanium-tungsten layer deposited on metal layer 402. Metal layer 402 is preferably deposited to be as thick as possible to minimize its resistance and the resulting RC delay. Metal layer 402 may be a layer of aluminum deposited to a thickness of 8000 Angstroms or 12000 Angstroms, for example. The thickness of metal layer 402 may be varied to meet specific application requirements.

Figure 3C:
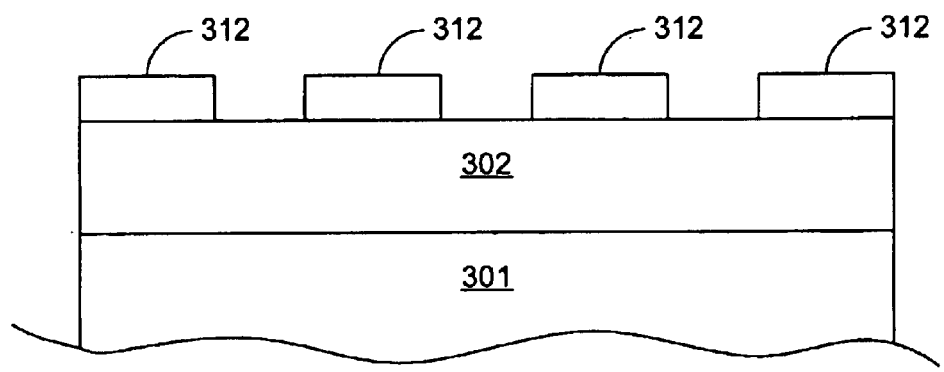

Continuing in FIG. 3(c), masks 312 are formed over metal 302. Masks 312 provide a pattern for etching metal 302 into one or more metal lines. A mask 312 may be of a resist material and formed by photolithography. A mask 312 may also be a hard mask. In applications where a relatively thick metal 302 is employed, mask 312 is preferably a hard mask to ensure there is enough masking material in the subsequent etching process. For example, a 3000 Angstroms thick silicon dioxide may be employed as a hard mask 312 on top of a 12000 Angstroms thick metal 302.

Figure 3D:
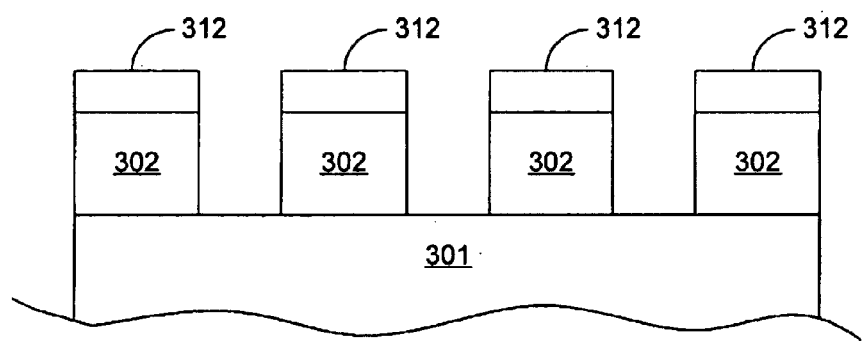

In FIG. 3(d), metal 302 is etched to form metal lines hereinafter referred to as "metal lines 302". A metal line 302 may be an integrated circuit structure for carrying electrical signals. Metal line 302 may be in a last metal level of an integrated circuit. That is, metal line 302 may be in a metal level just below a passivation level.

Figure 3E:
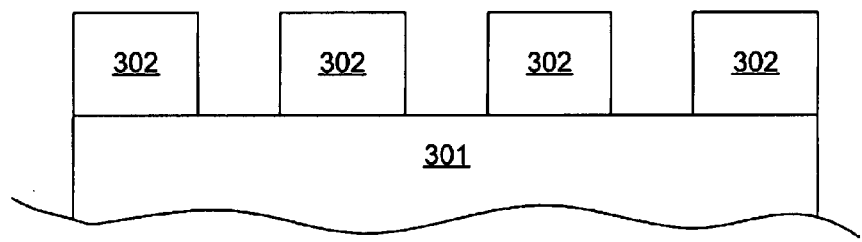

In FIG. 3(e), masks 312 are stripped. Depending on the material of hard masks 312, they may also be left in place. For example, a mask 312 of silicon dioxide does not have to be stripped from metal 302.

Figure 3F:
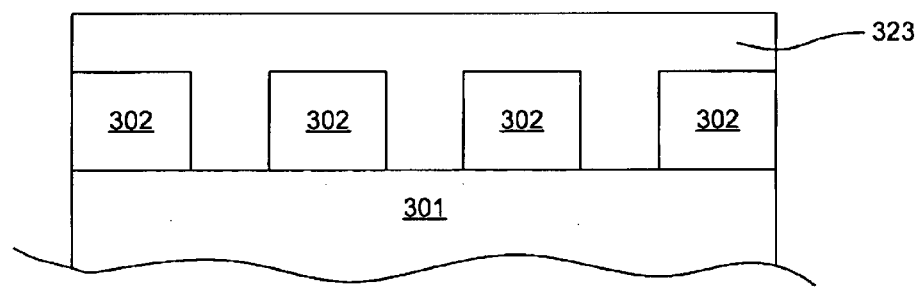

In FIG. 3(f), a passivation level is formed by first depositing a low-k dielectric 323 over and between metal lines 302. Low-k dielectric 323 may be a dielectric material having a relatively low dielectric constant. As used in the present disclosure, the term "low-k dielectric" refers to a dielectric material having a dielectric constant less than 3.9 (i.e., k<3.9).

In one embodiment where metal lines 302 are 8000 Angstroms thick, low-k dielectric 323 is deposited to a thickness of 5000 Angstroms. In another embodiment where metal lines 302 are 12000 Angstroms thick, low-k dielectric 323 is deposited to a thickness of 8000 Angstroms. Low-k dielectric 323 may be deposited by chemical vapor deposition or spin-on process. The thickness of low-k dielectric 323 may vary depending on the application.

Low-k dielectric 323 preferably has gap-fill capability to substantially fill spaces between metal lines 302. Although air gaps may not form between metal lines 302 because of the gap-fill capability, the relatively low dielectric constant of low-k dielectric 323 helps reduce capacitance and the resulting RC delay on metal lines 302. As can be appreciated, because low-k dielectric 323 does not depend on the formation of air gaps, the reduced capacitance may be achieved over a wide range of metal line spacing. Additionally, because there is no variability associated with air gap formation, the capacitance between metal lines (and the RC delay of the metal lines) will have a tighter distribution, and hence a more predictable value.

In one embodiment, low-k dielectric 323 is a dielectric material deposited using the Flowfill® dielectric deposition technology commercially available from Trikon Technologies of the United Kingdom (on the Internet: www.trikon.com). Other low-k dielectric materials, processes, and reactors may also be used. For example, low-k dielectric 323 may also be formed using the SiLK™ dielectric deposition technology commercially available from The Dow Chemical Company (on the Internet: www.silk.dow.com), or the fluorinated silicate glass (FSG) dielectric deposition technology from Novellus Systems, Inc. or Applied Materials, Inc. The aforementioned dielectric deposition technologies from Trikon Technologies and The Dow Chemical Company both provide a low-k dielectric 323 having a dielectric constant approximately less than 3 (i.e., k<3).

Figure 3G:
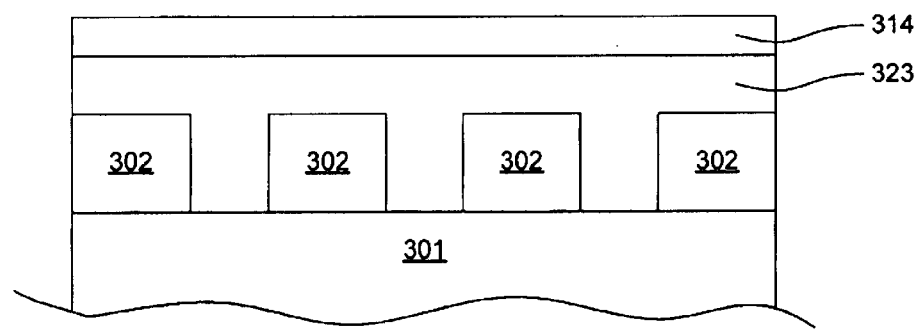

Continuing in FIG. 3(g), a dielectric 314 is optionally deposited over low-k dielectric 323. In one embodiment, dielectric 314 comprises silicon dioxide deposited to a thickness of 1000 Angstroms by PECVD. In the example of FIG. 3(g), dielectric 314 serves as a capping layer but may otherwise be omitted in most applications.

Figure 3H:
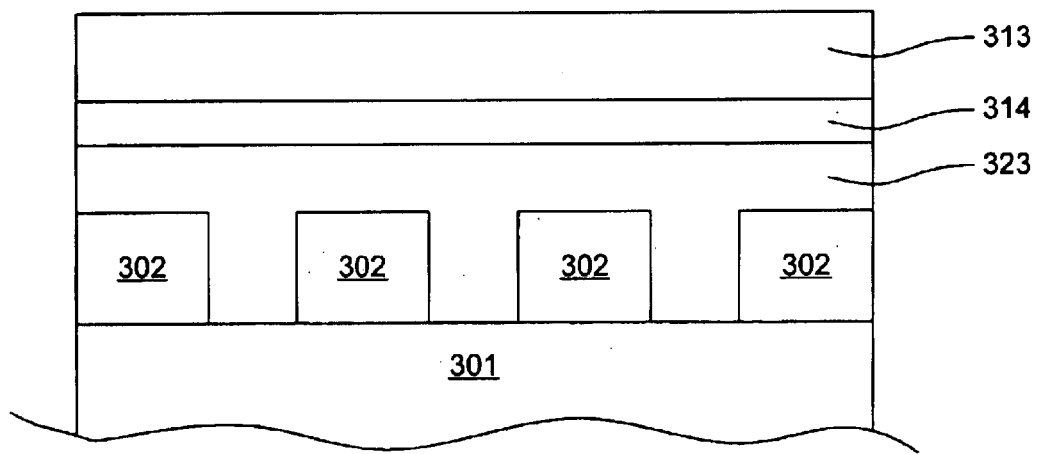

In FIG. 3(h), a topside material 313 is deposited over dielectric 314. Topside material 313, dielectric 314, and low-k dielectric 323 form a passivation level that helps protect metal lines 302 and other underlying structures. In one embodiment, topside material 313 is silicon nitride deposited to a thickness of 9000 Angstroms by PECVD.

It is to be noted that low-k dielectric 323 may absorb humidity when exposed to air or wet solvents. This may occur, for example, after etching a passivation level to expose metal pads. In that case, spacers may be formed on exposed portions of low-k dielectric 323. For example, silicon nitride spacers may be deposited along a sidewall including low-k dielectric 323. Techniques for protecting a low-k dielectric in a passivation level are also described in the commonly-assigned disclosure U.S. application Ser. No. 10/184,336, entitled "PROTECTION OF A LOW-K DIELECTRIC IN A PASSIVATION LEVEL,", filed on the Jun. 26, 2002 by Mira Ben-Tzur, Krishnaswamy Ramkumar, Tito Chowdhury, and Michal Efrati Fastow. The just mentioned disclosure is incorporated herein by reference in its entirety.

Figure 5:
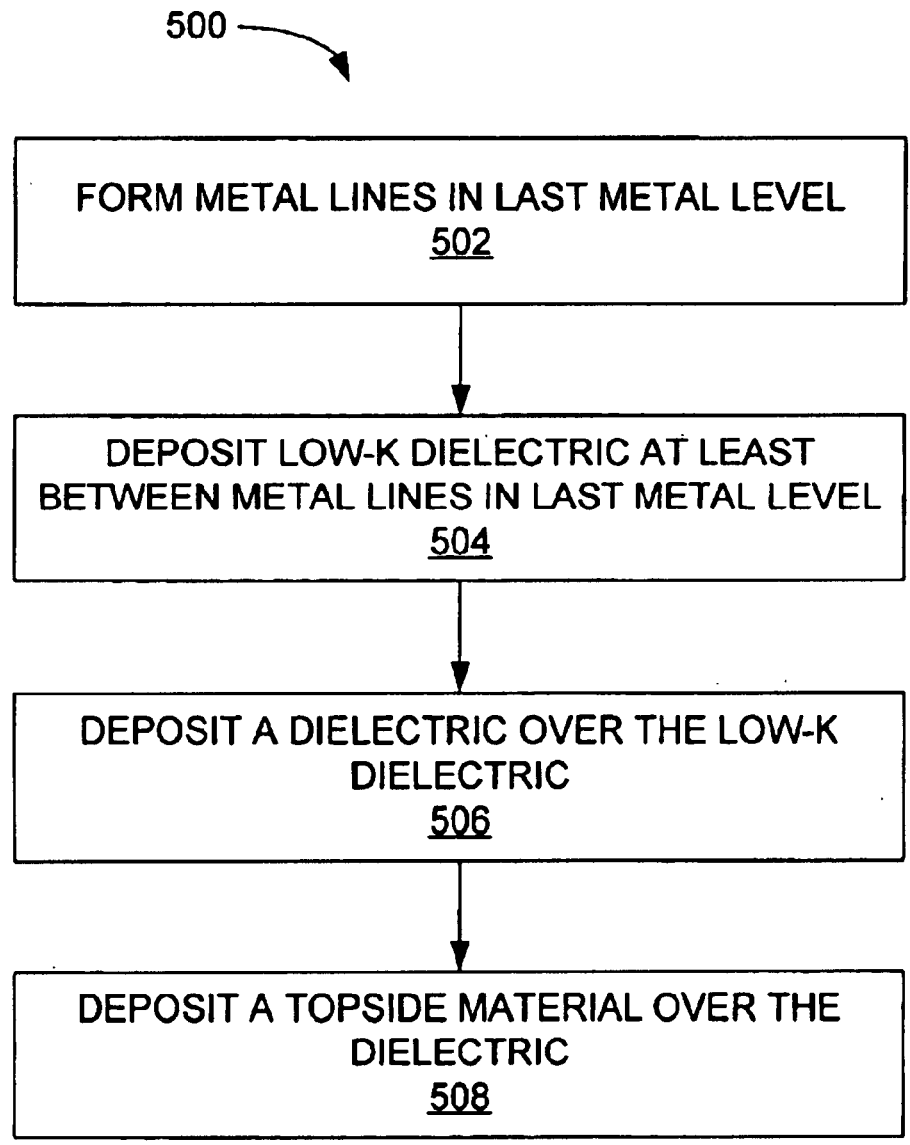
FIG. 5 shows a flow diagram of a method for fabricating an integrated circuit in accordance with an embodiment of the present invention.

Referring now to FIG. 5, there is shown a flow diagram of a method 500 for fabricating an integrated circuit in accordance with an embodiment of the present invention. In action 502, metal lines are formed in a last metal level just below the passivation level. Of course, the last metal level may also be the "first metal level" if it is the only metal level in the integrated circuit. The metal lines are preferably formed to be as thick as the application will allow to lower their resistance and the resulting RC delay. For example, a metal line may be formed to have a thickness between 8000 Angstroms and 15000 Angstroms, preferably 12000 Angstroms. In one embodiment, the metal lines are formed by first depositing a metal layer by physical vapor deposition, and then etching the metal layer.

In action 504, a low-k dielectric is deposited at least between metal lines in the last metal layer. The low-k dielectric preferably has gap fill capability to substantially fill the space between metal lines. In one embodiment, the low-k dielectric is deposited by PECVD and has a dielectric constant less than 3.9. The low-k dielectric may also be deposited using a spin-on process, for example.

In action 506, a layer of dielectric is optionally deposited at least over the low-k dielectric. In one embodiment, the layer of dielectric serves as a capping layer and is deposited over the low-k dielectric by PECVD. In another embodiment, the layer of dielectric is omitted.

In action 508, a topside material is deposited over the layer of dielectric. The topside material, the layer of dielectric, and the low-k dielectric form a passivation level that helps protect structures in the last metal level and underlying metal and dielectric levels.

Figure 6A:
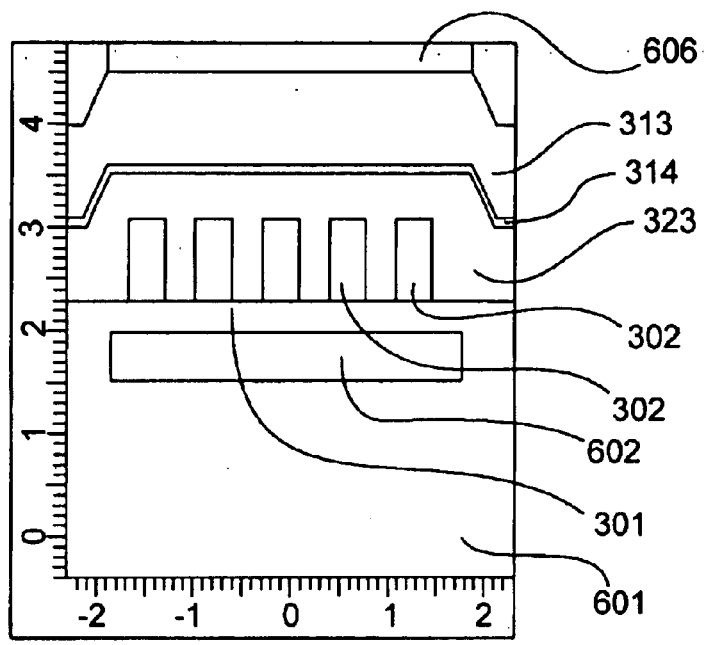
FIGS. 6(a)–6(f) schematically illustrate the effect of metal line spacing to a passivation level in accordance with an embodiment of the present invention.

FIGS. 6(a)–6(f) schematically illustrate the effect of metal line spacing to a passivation level having a low-k dielectric with gap fill capability. Referring to FIG. 6(a), a passivation level including low-k dielectric 323, dielectric 314, and topside material 313 protects metal lines 302. Metal lines 302 are formed over a dielectric 301. Also shown in FIG. 6(a) but not necessary to the present discussion are a dielectric 601, a metal 602, and air 606. (Note that some structures in FIGS. 6(a)–6(f) are not labeled for clarity of illustration.)

Figure 6B:
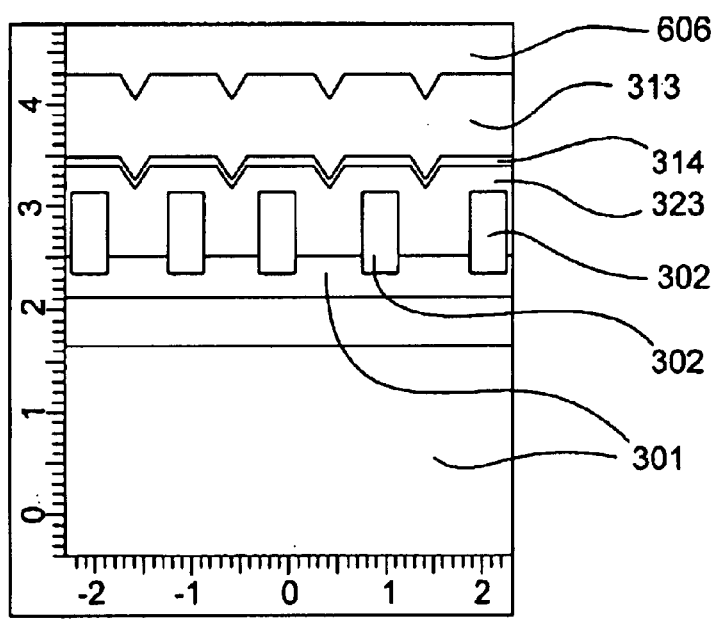
Figure 6C:
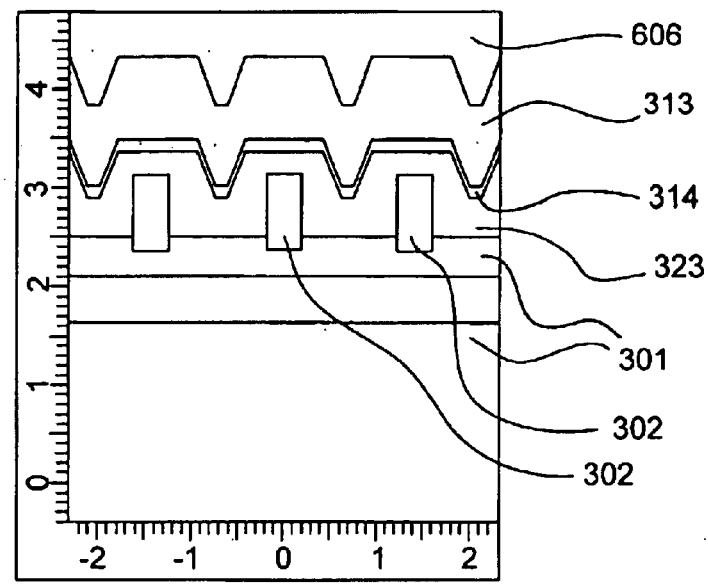
Figure 6D:
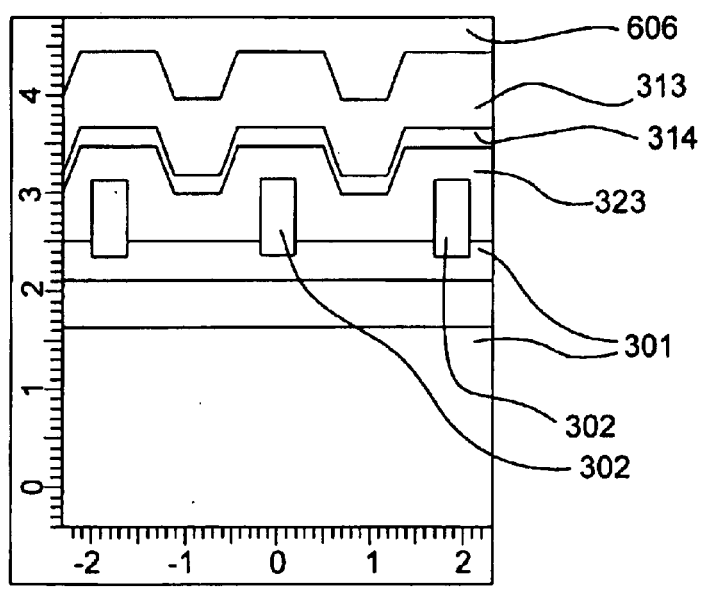
Figure 6E:
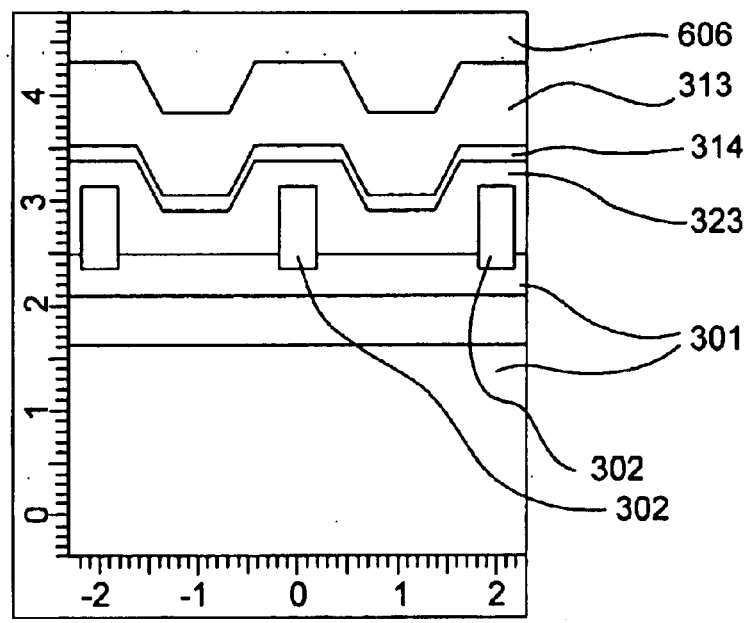
Figure 6F:
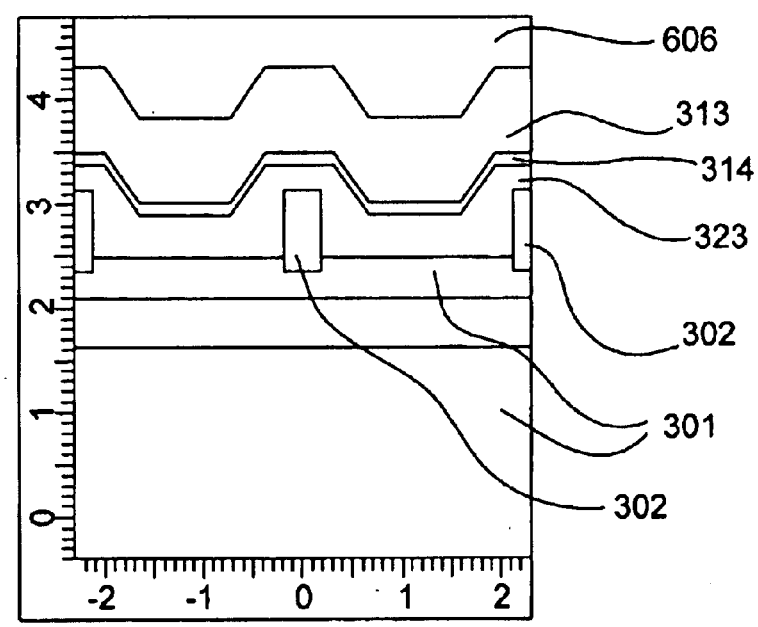

FIGS. 6(a)–6(f) show metal lines 302 as the space between them is widened. FIG. 6(b) shows metal lines 302 spaced apart wider than in FIG. 6(a), FIG. 6(c) shows metal lines 302 spaced apart wider than in FIG. 6(b), FIG. 6(d) shows metal lines 302 spaced apart wider than In FIG. 6(c), and so on. Because of the gap-fill capability of low-k dielectric 323, air gaps do not form between metal lines 302 even as the space between them is widened. However, the low dielectric constant of low-k dielectric 323 helps lower capacitance on metal lines 302. As can be appreciated by those of ordinary skill in the art reading the present disclosure, using a low-k dielectric in the passivation level not only helps in lowering RC delay, but also provides a tighter distribution of capacitance.

FIGS. 7(a)–7(d) show scanning electron micrographs of a cross-section of an integrated circuit in accordance with an embodiment of the present invention. In FIGS. 7(a)–7(d):

(a) each metal line 302A is an aluminum metal line 302 deposited to a thickness of approximately 8000 Angstroms by physical vapor deposition;

(b) low-k dielectric 323A is a low-k dielectric 323 deposited to a thickness of approximately 5000 Angstroms using the Flowfill® dielectric deposition technology from Trikon Technologies;

(c) dielectric 314A is a silicon dioxide dielectric 314 deposited to a thickness of approximately 1000 Angstroms by PECVD; and (d) topside material 313A is a topside material 313 of silicon nitride deposited to a thickness of approximately 9000 Angstroms by PECVD.

Figure 7A:
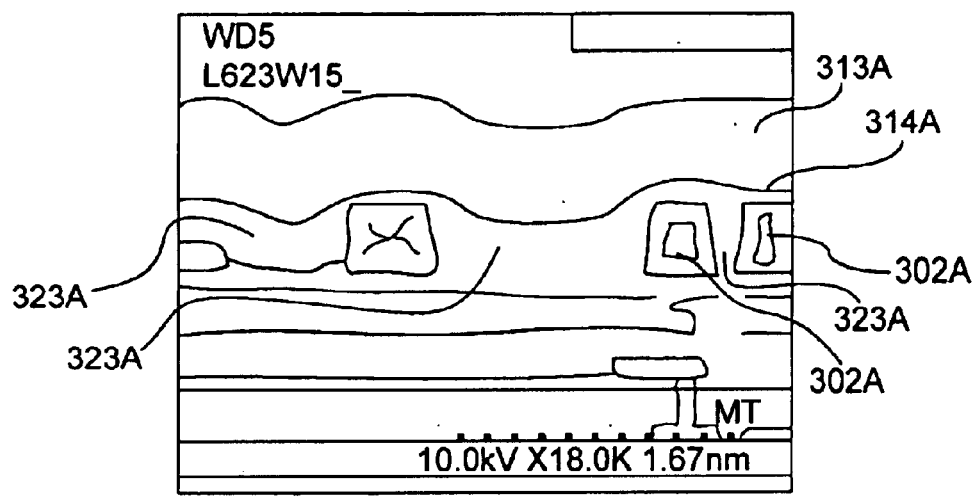
FIGS. 7(a)–7(d) show scanning electron micrographs of a cross-section of an integrated circuit in accordance with an embodiment of the present invention.
Figure 7B:
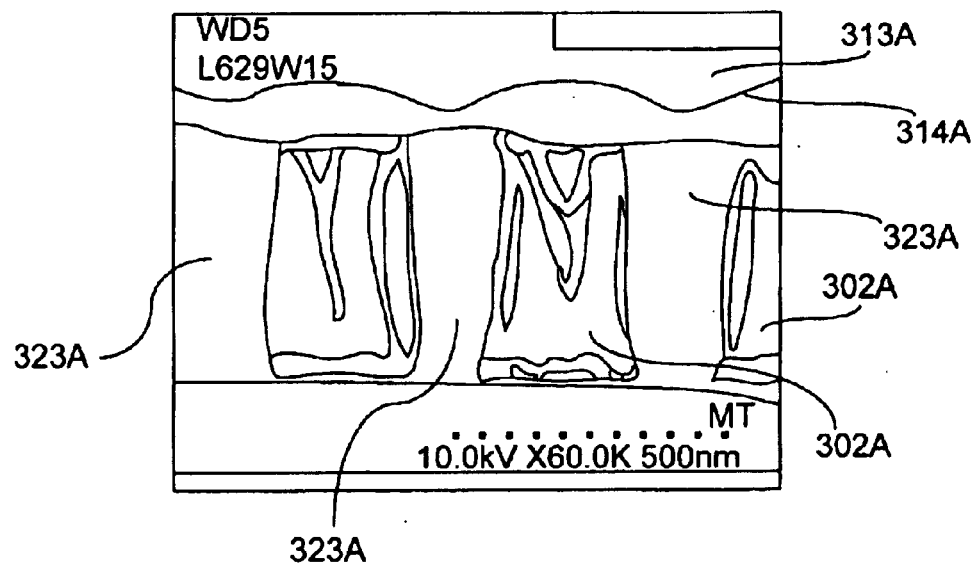
Figure 7C:
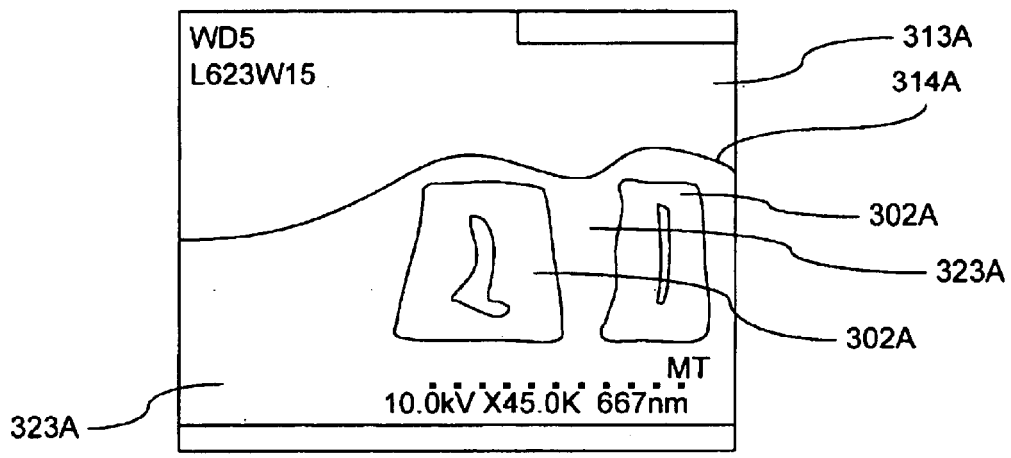
Figure 7D:
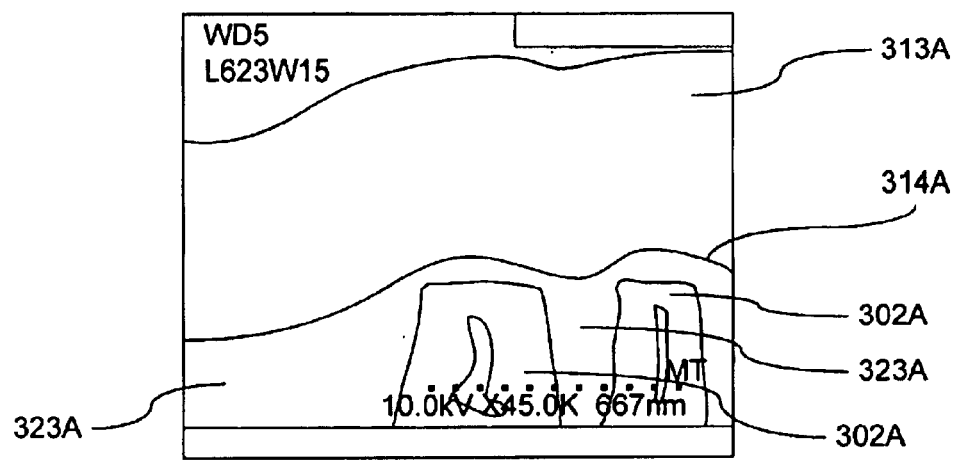

The micrographs of FIGS. 7(a)–7(d) show the planarity of a passivation level in accordance with an embodiment of the present invention and the gap fill capability of low-k dielectric 323A. As shown in FIG. 7(a), low-k dielectric 323A fills the space between wide spaced and closely spaced metal lines 302A, while providing relatively good planarity. FIG. 7(b) shows a magnified view of the closely spaced metal lines 302A on the right hand side of FIG. 7(a). FIG. 7(c) shows another magnified view of the closely spaced metal lines 302A on the right hand side of FIG. 7(a). FIG. 7(d) shows a different view of FIG. 7(c).

FIGS. 8(a)–8(d) show scanning electron micrographs of a cross-section of an integrated circuit in accordance with an embodiment of the present invention. In FIGS. 8(a)–8(d):

(a) each metal line 302B is an aluminum metal line 302 deposited to a thickness of approximately 12000 Angstroms by physical vapor deposition and patterned with a hard mask 804 of silicon dioxide;

(b) low-k dielectric 323B is a low-k dielectric 323 deposited to a thickness of approximately 8000 Angstroms using the Flowfill® dielectric deposition technology from Trikon Technologies;

(c) dielectric 314B is a dielectric 314 of silicon dioxide deposited to a thickness of approximately 1000 Angstroms by PECVD; and (d) topside material 313B is a topside material 313 of silicon nitride deposited to a thickness of approximately 9000 Angstroms by PECVD.

Figure 8A:
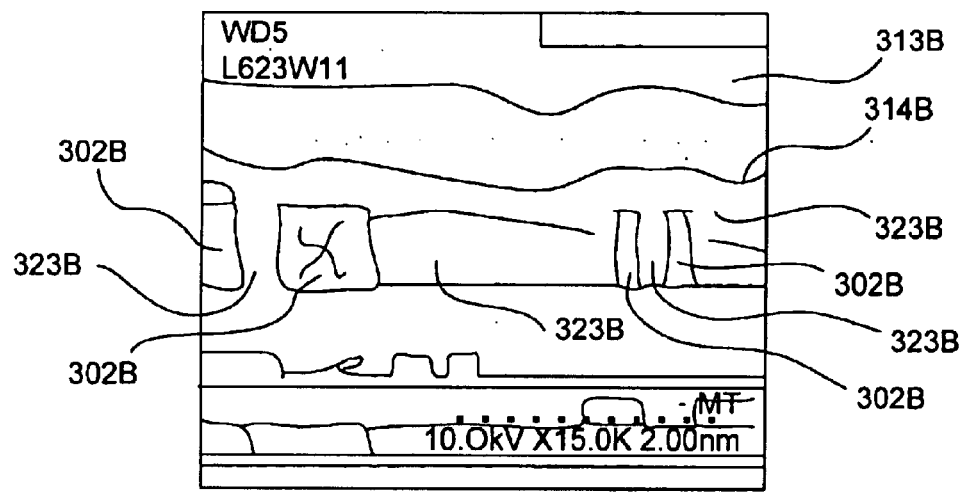
FIGS. 8(a)–8(d) show scanning electron micrographs of a cross-section of an integrated circuit in accordance with an embodiment of the present invention.
Figure 8B:
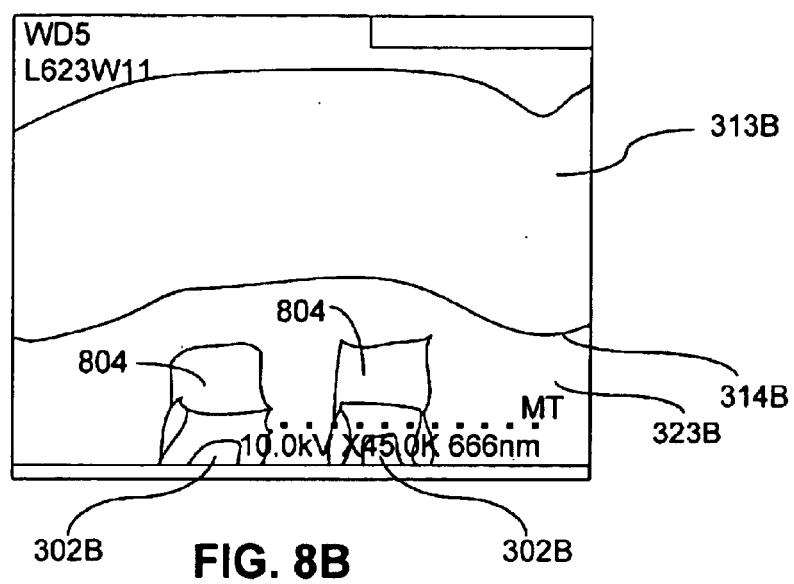
Figure 8C:
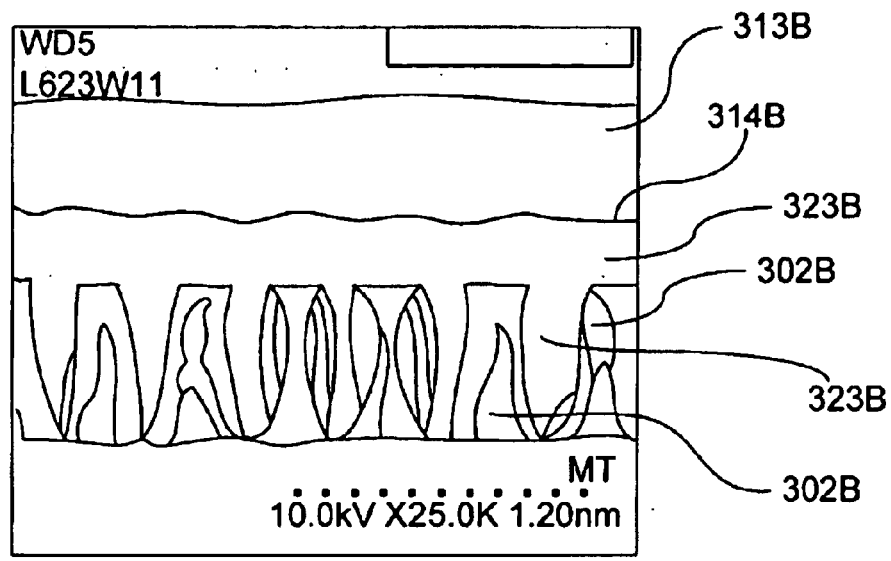
Figure 8D:
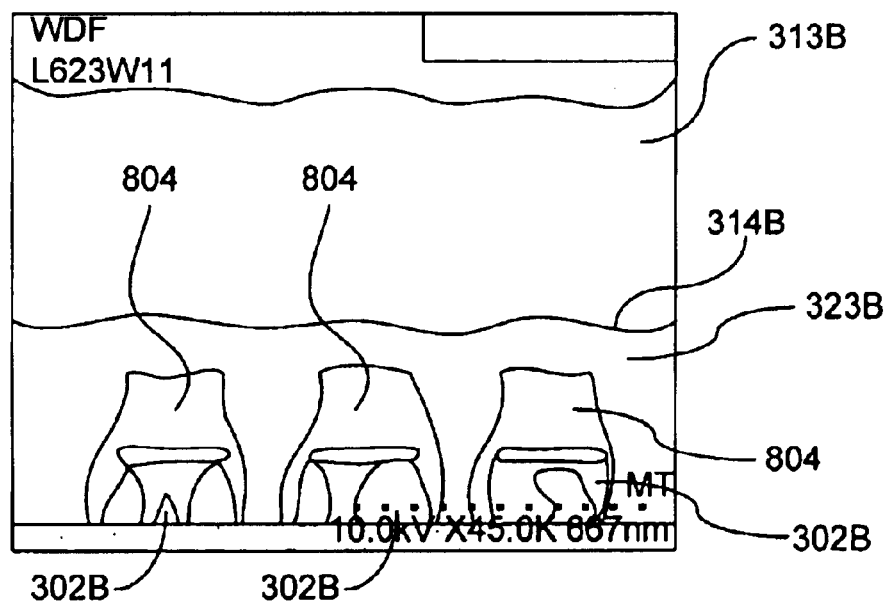

The micrographs of FIGS. 8(a)–8(d) show the planarity of a passivation level in accordance with an embodiment of the present invention and the gap fill capability of low-k dielectric 323B. As shown in FIG. 8(a), low-k dielectric 323B fills the space between wide spaced and closely spaced metal lines 302B, while providing relatively good planarity. FIG. 8(b) shows a magnified view of the closely spaced metal lines 302B on the right hand side of FIG. 8(a). Also shown in FIG. 8(b) are hard masks 804 of silicon dioxide deposited to a thickness of 3000 Angstroms by PECVD. Hard masks 804 were used as etching patterns in the formation of metal lines 302B. FIG. 8(c) shows closely spaced (e.g., 0.32 μm line spacing) metal lines 302B, while FIG. 8(d) shows a magnified view of FIG. 8(c).

Figure 9:
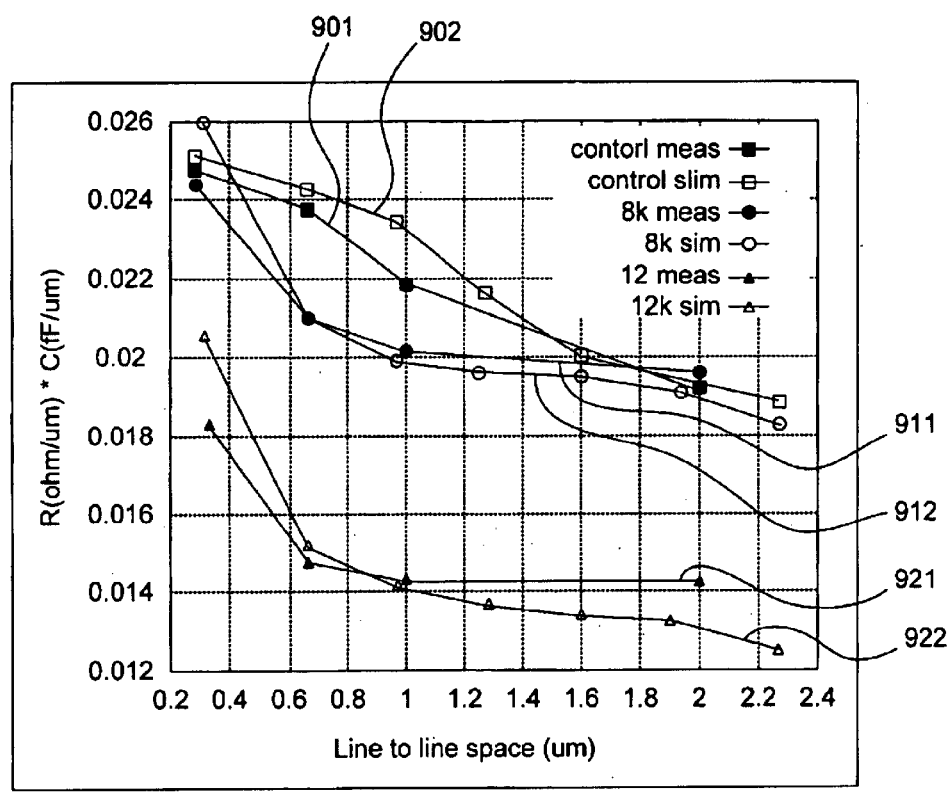
FIG. 9 shows plots illustrating measurement and simulation results for various metal lines in a last metal level.

FIG. 9 shows plots illustrating measurement and simulation results for various metal lines in a last metal level. The measurement results were obtained by performing electrical testing on the metal lines, while the simulation results were obtained using the Raphael™ simulation software from Avant! Corporation of Fremont, Calif. The electrical testing was performed using the charge-based capacitance measurement (CBCM) technique; e.g., see "A simple method for on-chip, sub-femto farad interconnect capacitance measurement," B. W. McGaughy and C. Hu, IEEE Electron Device Lett., page 21, January, 1997. The horizontal axis of FIG. 9 represents the space between metal lines, while the vertical axis represents the product of resistance and capacitance (hereinafter "RC product") for the metal line of interest.

In FIG. 9, plots 901 and 902 are the measured and simulated results, respectively, for a "control structure" having a "control metal line" such as a metal line 102 shown in FIG. 1. The control metal line is being used herein for comparison purposes. The control metal line was an aluminum metal line deposited to a thickness of about 8000 Angstroms by physical vapor deposition. The control metal line was approximately 60 μm long and formed in a last metal level (which in this case is the second metal level from the substrate). The control metal line was surrounded by grounded metal lines on the same metal level. A topside material of silicon nitride was deposited between the control metal line and adjacent metal lines. Underneath the control metal line was a layer of silicon dioxide that was approximately 3000 Angstroms thick. Underneath the silicon dioxide layer was a grounded metal plane.

Plots 911 and 912 are the measured and simulated results, respectively, for an aluminum metal line referred to herein as an "8 K metal line". The 8 K metal line was approximately 8000 Angstroms thick (hence the name), approximately 60 μm long, and formed in a last metal level (which in this case is the second metal level from the substrate). The 8 K metal line was surrounded by grounded metal lines on the same metal level. The low-k dielectric between the 8 K metal line and adjacent metal lines on the same metal level was a Flowfill® dielectric that was about 5000 Angstroms thick. The dielectric level below the 8 K metal line was of silicon dioxide. Underneath the silicon dioxide was a grounded metal plane.

Plots 921 and 922 are the measured and simulated results, respectively, for an aluminum metal line referred to herein as a "12 K metal line". The 12 K metal line was approximately 12000 Angstroms thick, approximately 60 μm long, and formed in a last metal level (which in this case is the second metal level from the substrate). The 12 K metal line was surrounded by grounded metal lines on the same metal level. The low-k dielectric between the 12 K metal line and adjacent metal lines on the same metal level was a Flowfill® dielectric that was about 8000 Angstroms thick. The dielectric level below the 12K metal line was of silicon dioxide. Underneath the silicon dioxide was a grounded metal plane.

As shown in FIG. 9, the respective RC products for the control metal line and the 8 K metal line are basically the same when the space between metal lines is relatively narrow. In the control case, air gaps tend to form between adjacent metal lines at narrow spaces. The air gaps have a low dielectric constant, which helps lower the capacitance on the control metal line. No air gap forms between the 8 K metal line and adjacent metal lines even at narrow spaces. However, the low-k dielectric between the 8 K metal line and adjacent metal lines helps in reducing capacitance.

At medium metal line spacing (e.g., between 0.5 μm to 1.0 μm), the 8 K metal line with low-k has a markedly lower capacitance compared to the control metal line. The silicon nitride topside material substantially fills the gap between the control metal line and adjacent metal lines as the space between them gets wider. This prevents the formation of capacitance-reducing air gaps. A low-k dielectric, on the other hand, does not depend on the formation of air gaps between adjacent metal lines to be effective and thus still provides a relatively low capacitance.

As the space between metal lines gets wider (e.g., wider than about 1.5 μm), capacitance on the metal lines is largely due to the dielectric constant of underlying dielectric levels. In other words, the advantage of low dielectric constant of the low-k dielectric between adjacent metal lines is less significant at wider metal line spacing. Thus, dielectric levels below the last metal level also preferably include a low-k dielectric to maximize capacitance reduction. For example, dielectric 301 shown in FIGS. 3(a)–3(h) is preferably a low-k dielectric such as a Flowfill®dielectric or FSG.

As can be appreciated by those of ordinary skill in the art reading the present disclosure, a low-k dielectric may be advantageously employed in passivation levels regardless of metal line spacing in the last metal level. A low-k dielectric in a passivation level has a relatively low dielectric constant over a wide range of metal line spacing and thus provides better process control. At narrow metal line spacing, a low-k dielectric does not depend on the formation of air gaps to be effective. At medium metal line spacing, a low-k dielectric provides a marked improvement in capacitance as compared to conventional oxide/nitride passivation, for example. A low-k dielectric may also be employed in underlying dielectric levels to further lower capacitance on metal lines, specially at wide metal line spacing.

Still referring to FIG. 9, the 12 K metal line (measured plot 921, simulated plot 922) results in lower RC product compared to the 8 K metal line and the control metal line. Although the 12 k metal line is thicker than the 8 K metal line and the control metal line, the capacitance on the 12 K metal line is still relatively low because of the low-K dielectric between adjacent metal lines. Additionally, the RC product of the 12 K metal line is lower than that of the 8 K metal line and the control metal line because of the 12 K metal line's lower resistance. Unlike the 8 K metal line, the 12 K metal line provides uniform RC product reduction over a wide range of space.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A structure in an integrated circuit, the structure comprising:
   a last metal level; and
   a passivation level comprising a low-k dielectric substantially filling a space extending between a sidewall of a metal line and a sidewall of another metal line in the last metal level, the low-k dielectric being over the metal line and the another metal line, the passivation level further comprising a layer of dielectric over the low-k dielectric.

2. The structure of claim 1 wherein the passivation level further comprises a topside material over the layer of dielectric.

3. The structure of claim 1 wherein the low-k dielectric has a dielectric constant less than about 3.9.

4. The structure of claim 1 wherein the metal line has a thickness between about 8000 Angstroms and about 15000 Angstroms.

5. A structure in an integrated circuit, the structure comprising:

means for carrying a signal in a last metal level;

means for reducing propagation delay of the signal, the means for reducing propagation delay of the signal comprising a low-k dielectric substantially filling a space between a sidewall of a metal line and a sidewall of an adjacent metal line in the last metal level, the low-k dielectric being over the metal line and the adjacent metal line; and means for covering the low-k dielectric.

6. The structure of claim 5 wherein the means for carrying the signal comprises a metal line having a thickness between about 8000 Angstroms and about 15000 Angstroms.

7. The structure of claim 5 wherein the means for covering the low-k dielectric comprises a layer of dielectric over the low-k dielectric and a topside material over the layer of dielectric.

8. The structure of claim 5 wherein the low-k dielectric has a dielectric constant less than about 3.9.

9. A structure in an integrated circuit, the structure comprising:

a plurality of metal lines over a first dielectric layer, the metal lines being in a last metal level;

a low-k dielectric between metal lines in the plurality of metal lines, the low-k dielectric substantially filling a space extending between a sidewall of a metal line and a sidewall of an adjacent metal line in the plurality of metal lines, the low-k dielectric being over the plurality of metal lines; and a dielectric layer over the low-k dielectric.

10. The structure of claim 9 wherein the low-k dielectric has a dielectric constant less than about 3.9.

11. The structure of claim 9 wherein the low-k dielectric is directly on the first dielectric layer.

12. The structure of claim 9 further comprising a a topside material over the dielectric layer.

\* \* \* \* \*